US008878285B2

(12) United States Patent
Ryu et al.

(10) Patent No.: US 8,878,285 B2
(45) Date of Patent: Nov. 4, 2014

(54) VERTICAL SEMICONDUCTOR DEVICE, MODULE AND SYSTEM EACH INCLUDING THE SAME, AND METHOD FOR MANUFACTURING THE VERTICAL SEMICONDUCTOR DEVICE

(71) Applicant: SK Hynix Inc., Icheon (KR)

(72) Inventors: Seong Wan Ryu, Yongin (KR); Min Soo Yoo, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/719,090

(22) Filed: Dec. 18, 2012

(65) Prior Publication Data

US 2014/0015034 A1 Jan. 16, 2014

(30) Foreign Application Priority Data

Jul. 16, 2012 (KR) .................. 10-2012-0077259

(51) Int. Cl.
| | | |
|---|---|---|
| *H01L 29/66* | (2006.01) | |
| *H01L 29/78* | (2006.01) | |
| *H01L 27/108* | (2006.01) | |
| *H01L 29/10* | (2006.01) | |
| *H01L 29/06* | (2006.01) | |

(52) U.S. Cl.
CPC .......... *H01L 29/7827* (2013.01); *H01L 27/108* (2013.01); *H01L 29/66666* (2013.01); *H01L 29/1087* (2013.01); *H01L 29/0653* (2013.01)
USPC .......................................... 257/329; 257/334

(58) Field of Classification Search
CPC ................................................ H01L 27/10876
USPC .................................................... 257/329, 334
See application file for complete search history.

(56) References Cited

U.S. PATENT DOCUMENTS

| | | | |
|---|---|---|---|
| 7,626,219 B2 | 12/2009 | Forbes | |
| 7,951,667 B2 * | 5/2011 | Kim ............... | 438/253 |
| 8,124,479 B2 * | 2/2012 | Jang ............... | 438/268 |
| 8,653,584 B2 * | 2/2014 | Renn ............... | 257/328 |
| 2009/0114978 A1 | 5/2009 | Cha | |
| 2010/0301407 A1 * | 12/2010 | Sung ............... | 257/329 |
| 2011/0127605 A1 * | 6/2011 | Kim ............... | 257/334 |
| 2011/0223731 A1 * | 9/2011 | Chung et al. .......... | 438/270 |
| 2011/0227145 A1 * | 9/2011 | Renn ............... | 257/328 |
| 2012/0021575 A1 * | 1/2012 | Jang ............... | 438/269 |
| 2012/0269006 A1 * | 10/2012 | Park ............... | 365/189.05 |
| 2013/0105872 A1 * | 5/2013 | Kim et al. ............ | 257/296 |
| 2013/0214415 A1 * | 8/2013 | Pachamuthu et al. ......... | 257/751 |

FOREIGN PATENT DOCUMENTS

| | | | |
|---|---|---|---|
| KR | 2009-0066488 | * | 10/2008 |
| KR | 2009-104978 | * | 10/2009 |
| KR | 10-0929635 | | 11/2009 |

* cited by examiner

*Primary Examiner* — A. Sefer

(57) ABSTRACT

A vertical semiconductor device having a vertical channel region is disclosed. The vertical semiconductor device includes a pillar having a vertical channel region, a bit line buried in a semiconductor substrate located at a lower part of the pillar, and a body connection unit configured to couple at least one sidewall of the pillar to the semiconductor substrate. As a result, the floating body effect of the vertical semiconductor device can be more effectively removed.

19 Claims, 18 Drawing Sheets

VERTICAL SEMICONDUCTOR DEVICE, MODULE AND SYSTEM EACH INCLUDING THE SAME, AND METHOD FOR MANUFACTURING THE VERTICAL SEMICONDUCTOR DEVICE

CROSS-REFERENCE TO RELATED APPLICATION

The priority of Korean patent application No. 10-2012-0077259 filed on 16 Jul. 2012, the disclosure of which is hereby incorporated in its entirety by reference, is claimed.

BACKGROUND OF THE INVENTION

Embodiments of the present invention relate to a vertical semiconductor device, and more particularly to a vertical semiconductor device for effectively removing a floating body effect, a module and system each including the same, and a method for manufacturing the vertical semiconductor device.

With the increasing integration degree of semiconductor devices, the demand of DRAM devices of 40 nm or less is rapidly increasing. However, it is very difficult to reduce a unit cell size of a transistor in $8F^2$ (F: minimum feature size) or $6F^2$ cell structure down to 40 nm or less. Therefore, a DRAM device having a $4F^2$ cell structure has been developed to increase integration by about 1.5~2 times.

In order to construct the $4F^2$ cell structure, a source unit and a drain unit of a cell transistor may be formed in a $1F^2$-sized region. For this purpose, many companies are conducting intensive research into a vertical-type cell transistor structure in which the source unit and the drain unit can be formed within the $1F^2$-sized region. The vertical-type cell transistor configures a channel of a transistor for operating the cell in the form of a pillar, and includes a source region and a drain region in an upper part and a lower part, respectively.

However, a bit line junction region of the $4F^2$ cell structure is formed as an One Side Contact (OSC) at a lateral surface of a lower part of the pillar.

Therefore, if the bit line junction region is formed to have a shallow junction depth, a region where a gate overlaps with the junction region is narrow, such that channel resistance is increased and a threshold voltage is increased. On the other hand, if the bit line junction region is formed to have a deep junction depth, such that there is an increased area of overlap between the gate and the junction region, a pillar is isolated from the underlying substrate, so that a floating body effect arises.

BRIEF SUMMARY OF THE INVENTION

Various embodiments of the present invention are directed to providing a vertical semiconductor device, a module and a system each including the same, and a method for manufacturing the vertical semiconductor device that substantially obviate one or more problems due to limitations and disadvantages of the related art.

An embodiment of the present invention relates to a technology for effectively removing the floating body effect in which a pillar body having a vertical channel region is formed in a semiconductor device having a vertical channel region.

In accordance with an aspect of the present invention, a vertical semiconductor device includes: a pillar having a vertical channel region; a bit line buried in a semiconductor substrate and located under the pillar; and at least one body connection unit configured to couple at least one sidewall of the pillar to the semiconductor substrate.

The vertical semiconductor device may further include: a lower junction region formed between the pillar and the bit line; and an upper junction region formed over the pillar. Each of the lower junction region and the upper junction region may include an amorphous silicon layer or polysilicon layer doped with impurities.

The vertical semiconductor device may further include an insulation film formed below the bit line.

The vertical semiconductor device may further include a barrier metal layer formed between the lower junction region and the bit line.

The vertical semiconductor device may further include a gate located at one or more sidewalls of the pillar.

The body connection unit may be symmetrically located at both sidewalls of the pillar, or may be located only at one sidewall of the pillar.

The pillar may be an epitaxial growth layer. The body connection unit may be formed of the same material as the pillar.

The vertical semiconductor device may further include an air-gap located between the bit lines adjacent to each other.

The vertical semiconductor device may further include: a field stop layer formed by implanting impurities into a lower part of the air-gap.

In accordance with another aspect of the present invention, a method for forming a vertical semiconductor device includes: forming a first recess by etching a semiconductor substrate; forming a bit line at a lower part of the first recess; forming a silicon layer over the semiconductor substrate and the bit line so as to bury the bit line; forming a second recess by etching the silicon layer and the semiconductor substrate that are located between the bit lines, wherein the etched silicon layer is coupled to the semiconductor substrate; forming a pillar by etching the silicon layer in a specific direction crossing the bit line; and forming a gate at a sidewall of the pillar.

In accordance with another aspect of the present invention, a vertical semiconductor device includes: a cell array including several memory cells that are coupled to a word line and a bit line and arranged in the form of a matrix; and a sense-amp coupled to the bit line so as to sense data stored in the memory cell, wherein the memory cell includes: a pillar having a vertical channel region, a bit line buried in a semiconductor substrate located at a lower part of the pillar, and a body connection unit configured to couple at least one sidewall of the pillar to the semiconductor substrate.

In accordance with another aspect of the present invention, a semiconductor module including a plurality of semiconductor devices mounted to a substrate includes: each of the semiconductor devices serving as a vertical semiconductor device, wherein the vertical semiconductor device includes: a pillar having a vertical channel region; a bit line buried in a semiconductor substrate located at a lower part of the pillar; and a body connection unit configured to couple at least one sidewall of the pillar to the semiconductor substrate.

In accordance with another aspect of the present invention, a semiconductor system including not only a semiconductor module having a plurality of semiconductor devices mounted to a substrate but also a controller for controlling the semiconductor module, includes: each of the semiconductor devices serving as a vertical semiconductor device, wherein the vertical semiconductor device includes: a pillar having a vertical channel region; a bit line buried in a semiconductor substrate located at a lower part of the pillar; and a body connection unit configured to couple at least one sidewall of the pillar to the semiconductor substrate.

In accordance with another aspect of the present invention, a computer system including not only a semiconductor system having at least one semiconductor module but also a controller for processing data stored in the semiconductor system, includes: the semiconductor module including a plurality of semiconductor devices mounted to a substrate, wherein the semiconductor device serving as a vertical semiconductor device includes: a pillar having a vertical channel region; a bit line buried in a semiconductor substrate located at a lower part of the pillar; and a body connection unit configured to couple at least one sidewall of the pillar to the semiconductor substrate.

In accordance with another aspect of the present invention, a data processing system including one or more semiconductor devices mounted to a substrate, includes: each of the semiconductor devices serving as a vertical semiconductor device, wherein the vertical semiconductor device includes: a pillar having a vertical channel region; a bit line buried in a semiconductor substrate located at a lower part of the pillar; and a body connection unit configured to couple at least one sidewall of the pillar to the semiconductor substrate.

In accordance with another aspect of the present invention, an electronic system including at least one data processing system includes: the data processing system including at least one semiconductor device mounted to a substrate, wherein the semiconductor device serving as a vertical semiconductor device includes: a pillar having a vertical channel region; a bit line buried in a semiconductor substrate located at a lower part of the pillar; and a body connection unit configured to couple at least one sidewall of the pillar to the semiconductor substrate.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
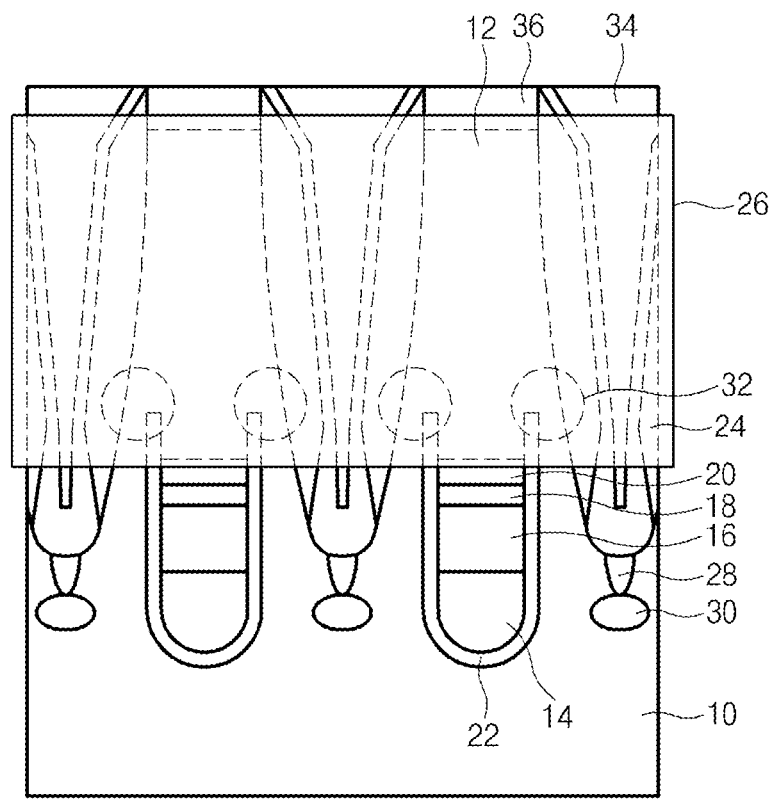
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, a pillar 12 including a vertical channel region is formed over a semiconductor substrate 10. An insulation film 14, a bit line 16, a barrier metal layer 18, and a lower junction region 20 are sequentially deposited at a lower part of the pillar 12. The insulation film 14, the bit line 16, the barrier metal layer 18, and the lower junction region 20 are buried in the semiconductor substrate 10. In this case, the insulation film 14 is formed to reduce parasitic capacitance between the bit line 16 and the substrate 10. An insulation film 22 is formed over sidewalls of a stack of the bit line 16, the barrier metal layer 18, and the lower junction region 20. In an embodiment, an air gap is used as an insulation film 28 between adjacent bit lines 16, and a field stop layer 30 in which P-type impurities are implanted is formed below a lower part of the air gap 28. An upper junction region 36 is formed at an upper part of the pillar 12.

The pillar 12 may be formed as an epitaxial growth layer, and may be formed by any of Solid Phase Epitaxy (SPE) and Silicon Epitaxial Growth (SEG). The bit line 16 may include tungsten (W), and the barrier metal layer 18 may include either a laminate structure of titanium (Ti) and titanium nitride (TiN) or a cobalt (Co) material. The lower junction region 20 and the upper junction region 36 may include either polysilicon or amorphous silicon in which N-type impurities are implanted with high density.

In accordance with one embodiment of the present invention, the bit line 16 is buried in the semiconductor substrate 10, an air-gap 28 is formed between the bit lines 16, and parasitic capacitance among adjacent bit lines 16 is reduced, so that sensing margin and data retention characteristics can be improved. In an embodiment, the air-gap 28 may be replaced with another insulating material.

A spacer 24 is formed at first and second sidewalls of the pillar 12. A gate 26 extending in a first direction perpendicular to the bit line 16 is formed at third or fourth sidewalls (having no spacer 24) of the pillar 12. The bit line 16 extends in a second direction crossing the first direction. An interlayer insulation film 34 is formed between adjacent pillars 12. The interlayer insulation film 34 includes an insulation material that has a poor step coverage property to form the air-gap 28.

Specifically, a body connection unit 32, which is configured to couple a body of the pillar 12 to the semiconductor substrate 10, is formed at a lower portion of the pillar 12, to effectively prevent the floating body effect. Although the body connection unit 32 may be symmetrically formed at both of the first and the second sidewalls of the pillar 12 as shown in FIG. 1. In other words, the body connection unit 32 may be formed at two opposing sidewalls of the pillar 32 so that the body connection unit is arranged symmetrically in a view of the pillar 32, as shown in FIG. 1. However, it should be noted that the body connection unit 36 of FIG. 12 may be formed at any of the first through the fourth sidewalls of the pillar 32 in an asymmetrical configuration.

FIGS. 2 to 10 are cross-sectional views illustrating a method for forming the semiconductor device of FIG. 1.

Figure 2:
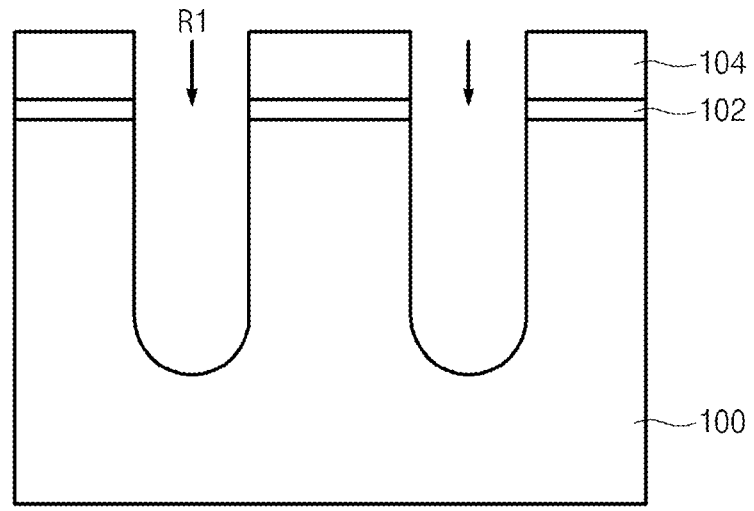
FIGS. 2 to 10 are cross-sectional views illustrating a method for forming the semiconductor device of FIG. 1.

Referring to FIG. 2, after an oxide film 102 and a hard mask layer 104 are formed over the semiconductor substrate, a photoresist pattern (not shown) defining a specific region in which a bit line is to be formed is formed over the hard mask layer 104 through a photolithography process. In other words, a photoresist pattern is formed for opening a specific region in which the bit line is to be formed.

Subsequently, the hard mask layer 104 is etched using the photoresist pattern as an etch mask, so that the hard mask pattern 104 is formed. The oxide film 102 and the semiconductor substrate 100 are etched using the hard mask pattern 104 as an etch mask, so that a recess R1 is formed. Preferably, the recess R1 may have a depth of 50~300 nm. Preferably, a treatment process for recovering a damaged surface of the recess R1 may be performed after formation of the recess R1. The treatment process may include an annealing process using a gas including $H_2$.

Figure 3:
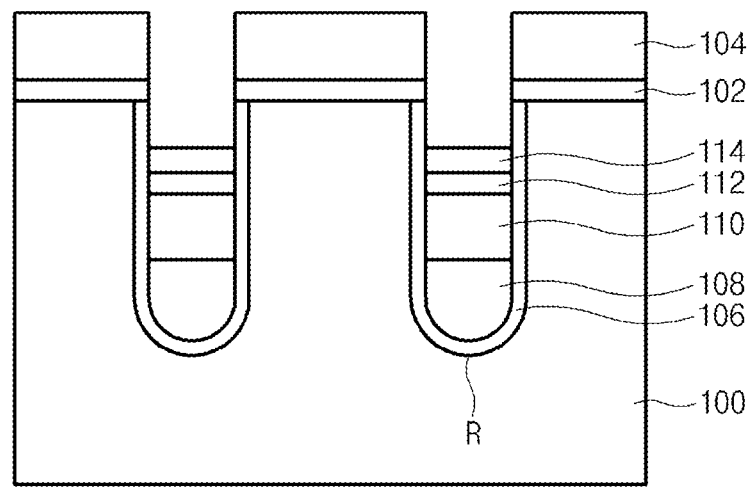

Referring to FIG. 3, after an insulation film 106 is formed along an inner surface of the recess R1, an insulation film 108 is formed to fill the recess R1. Subsequently, the insulation film 108 is etched back so that the resultant insulation film 108 remains only at a lower part of the recess R1. In an embodiment, the insulation film 108 may be formed to have a thickness of about 10~100 nm. The insulation film 108 may be formed to reduce parasitic capacitance between the substrate 100 and the bit line 110 which will be formed in a subsequent process.

Thereafter, a bit line metal material is formed over the insulation film 108 and is then etched back, so that the bit line 110 is formed. A barrier metal material is formed over the bit line 110 and is then etched back so that a metal layer 112 is formed. Subsequently, an amorphous silicon layer or polysilicon layer doped with high-density impurities (N-type impurities) is formed over the barrier metal layer 110, and is then etched back, so that a lower junction region 114 is formed.

In an embodiment, the bit line 110 includes a metal material. The barrier metal layer 112 may include either a laminate structure of titanium (Ti) and titanium nitride (TiN) or a cobalt (Co) material. The metal material may include tungsten (W), copper (Cu) or aluminum (Al). A laminate structure of the bit line 110, the barrier metal layer 112 and the lower junction region 114 may be formed to have a thickness of about 10~400 nm.

Figure 4:
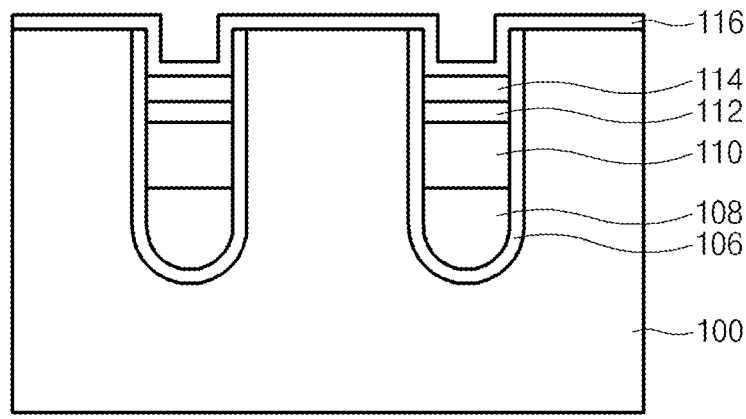

Referring to FIG. 4, the hard mask pattern 104 and the oxide film 102 are removed.

An undoped amorphous silicon layer 116 is formed over the lower junction region 114 and the semiconductor substrate 100 through a Solid Phase Epitaxial (SPE) process. Then, the undoped amorphous silicon layer 116 is annealed and crystallized.

Figure 5:
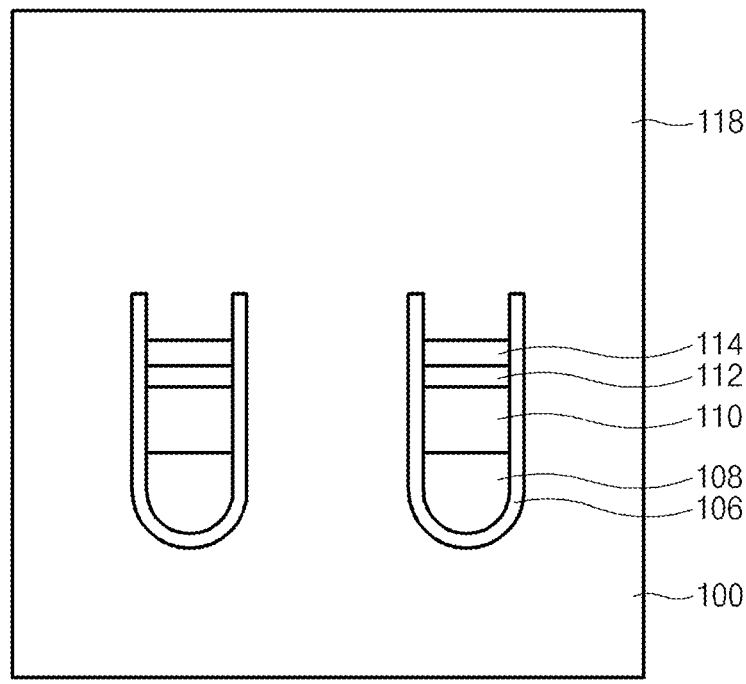

Referring to FIG. 5, a silicon epitaxial growth (SEG) process may be performed using the crystallized silicon layer as a seed, so that a silicon layer 118 is formed over the lower junction region 114 and the semiconductor substrate 100. The silicon layer 118 is then planarized. The silicon layer 118 may be grown not only by a selective epitaxial growth process, but also by a heat treatment at a temperature of 200 to 1000 degrees Celsius and under $H_2$ atmosphere for 10 to 120 minutes.

Figure 6:
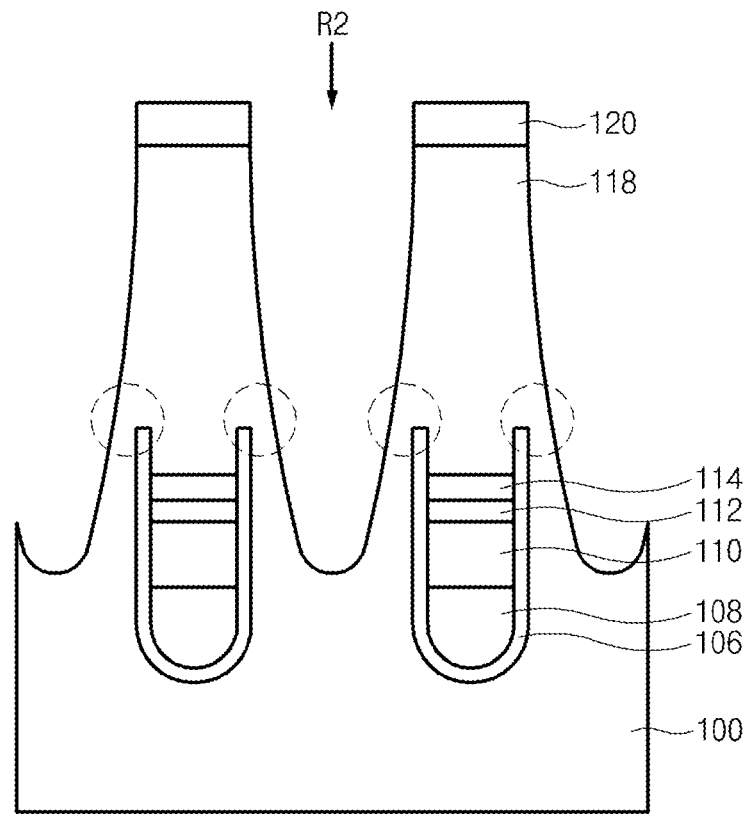

Referring to FIG. 6, after a hard mask layer (not shown) is formed over the silicon layer 118, a photoresist pattern (not shown) defining a bit line region is formed over the hard mask layer using a general a photolithography process. Unlike the photoresist pattern shown in FIG. 2, the photoresist pattern of FIG. 6 is formed so that the bit line region is covered and the remaining regions are opened.

Thereafter, the hard mask layer is etched using the photoresist pattern as an etch mask so that the hard mask pattern 120 is formed. Subsequently, the silicon layer 118 and the semiconductor substrate 100 are etched in a tilted etching manner using the hard mask pattern 120 as an etch mask, so that the recess R2 is formed. The silicon layer 118 is formed in a line type extending in the same direction as that of the bit line 110, and has a tapered sidewall profile. In an embodiment, the recess R2 may be etched down to a level that is higher than the bottom of the bit line 110.

When being etched, the silicon layer 118 is etched obliquely so that the insulation film 106 is not exposed and the silicon layer 118 remains over the insulation film 106. As a result, the etched silicon layer 118 is coupled to the semiconductor substrate 100. That is, at least one body connection unit (denoted by a dotted circle) is formed in a manner that couples the etched silicon layer 118 to the semiconductor substrate 100 adjacent to a stack of the barrier metal layer 112, the bit line 110, and insulation films (106, 108) that are formed at a lower part of the etched silicon layer 118.

Figure 7:
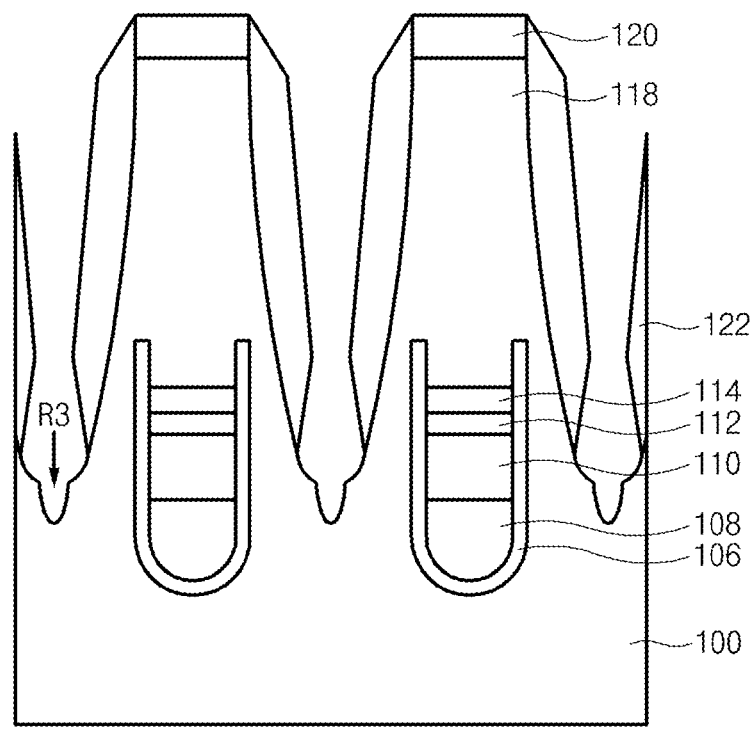

Referring to FIG. 7, after a spacer 122 is formed at a sidewall of the recess R2, a bottom surface of the recess R2 is further etched using the spacer 122 as an etch mask, so that a recess R3 is formed. Preferably, the recess R3 may be etched down to a level lower than the bottom of the bit line 110.

Figure 8:
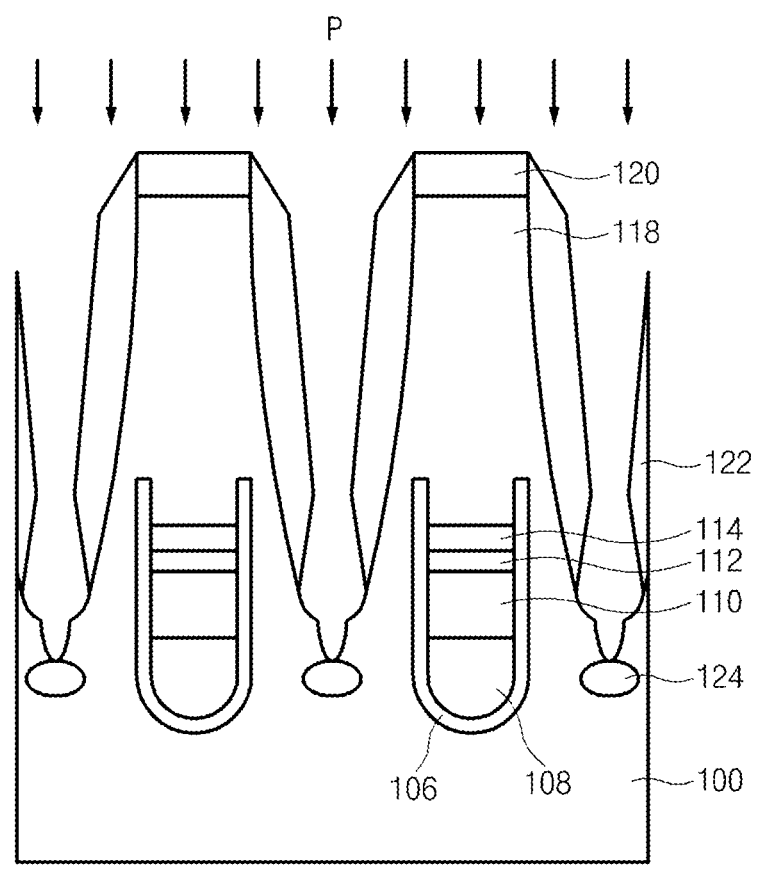

Subsequently, referring to FIG. 8, P-type impurities are implanted into a lower part of the recess R3, so that a field stop layer 124 is formed.

Figure 9:
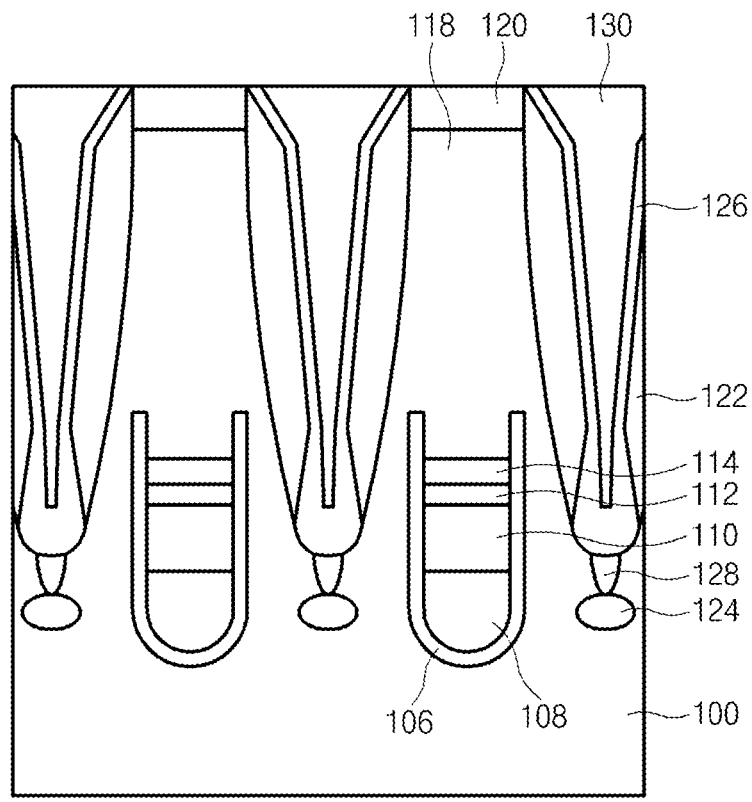

Referring to FIG. 9, an insulation material 126 having poor step coverage characteristics is deposited into the recess R2 in such a manner that the recess R3 is not uniformly filled with the insulation material 126, so that the air-gap 128 is formed. Thus, the air-gap 128 is formed between the adjacent bit lines 110, and parasitic capacitance between bit lines is reduced, so that the sensing margin and data retention characteristics can be improved.

Subsequently, an interlayer insulation film 130 is formed to fill the recess R2, and is then planarized.

Figure 10:
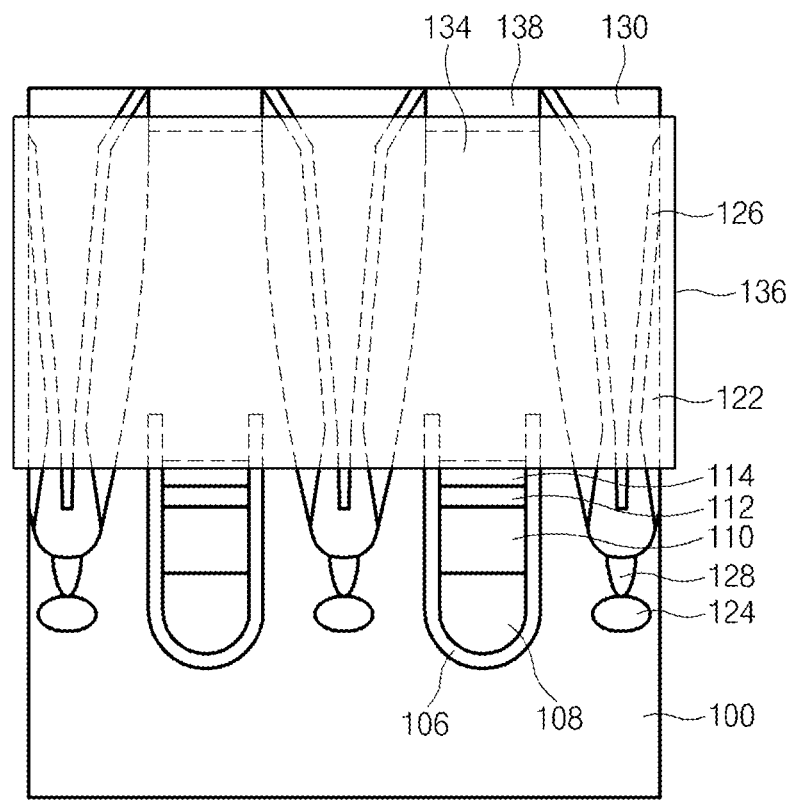
Figure 11:
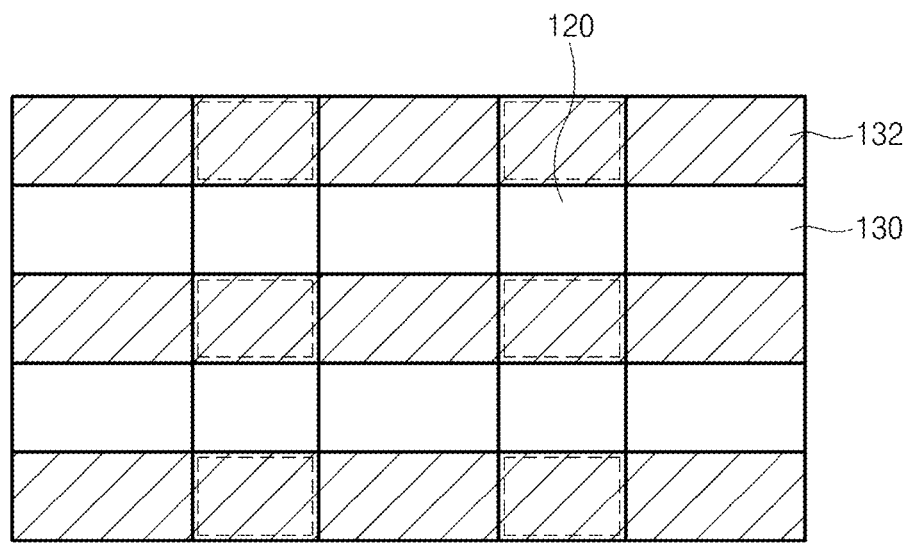
FIG. 11 is a plan view illustrating a plan structure of FIG. 10.

Referring to FIGS. 10 and 11, a line-type mask pattern 132 defining a pillar region is formed over the interlayer insulation film 130 and the hard mask pattern 120. In other words, in order to form a pillar 134 in an active region in which a transistor is to be formed by etching the line-type silicon layer 118, a line-type mask 132 extending perpendicular to the bit line 110 is formed over the interlayer insulation film 130 and the hard mask pattern 120. Thus, referring to FIG. 11, a region in which the pillar 134 will be formed is defined in a region (denoted by a dotted square) in which the hard mask pattern 120 overlaps with the mask pattern 132.

Subsequently, the silicon layer 118, the hard mask pattern 120, and the interlayer insulation film 130 are etched using the mask pattern 132 as an etch mask, so that a line-type recess (not shown) is formed in the silicon layer 118, resulting in formation of a pillar 134. First and the second sidewalls of the pillar 134 have tapered sidewall profiles, respectively. Subsequently, after a gate insulation film (not shown) is formed at third and fourth sidewalls of the pillar 134 exposed by the recess, a gate 136 extending perpendicular to the bit line 110 is formed over the gate insulation film. That is, the line-type gate 136 is coupled to the third and the fourth sidewalls of the pillar 134.

Subsequently, an interlayer insulation film (not shown) is formed to fill a space between the gates 136, and the hard mask pattern 120 is then removed. An amorphous silicon or polysilicon layer doped with high-density impurities (N-type impurities) is formed over the pillar 134 so that an upper junction region 138 is formed.

Figure 12:
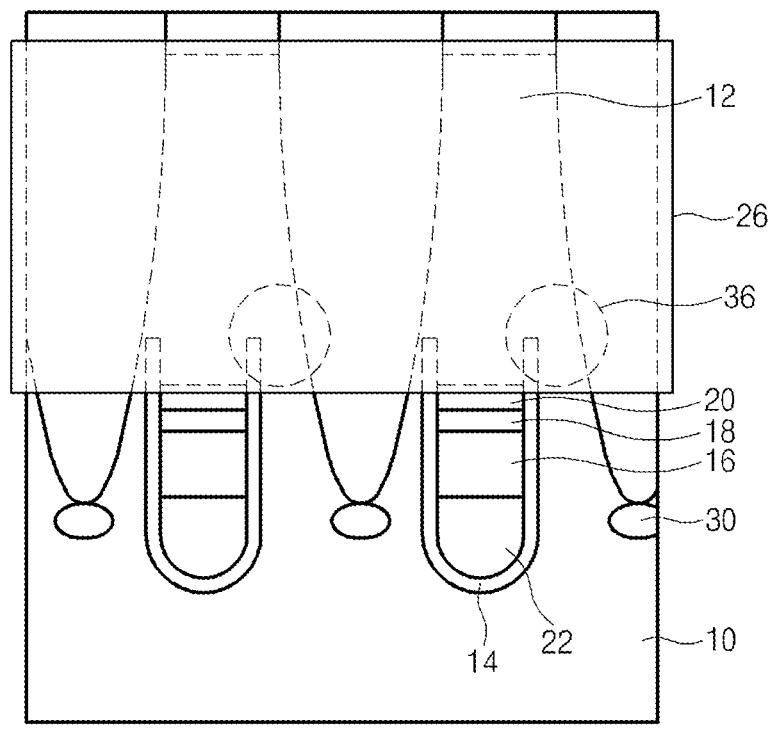
FIG. 12 is a cross-sectional view illustrating a semiconductor device according to another embodiment of the present invention.
Figure 13:
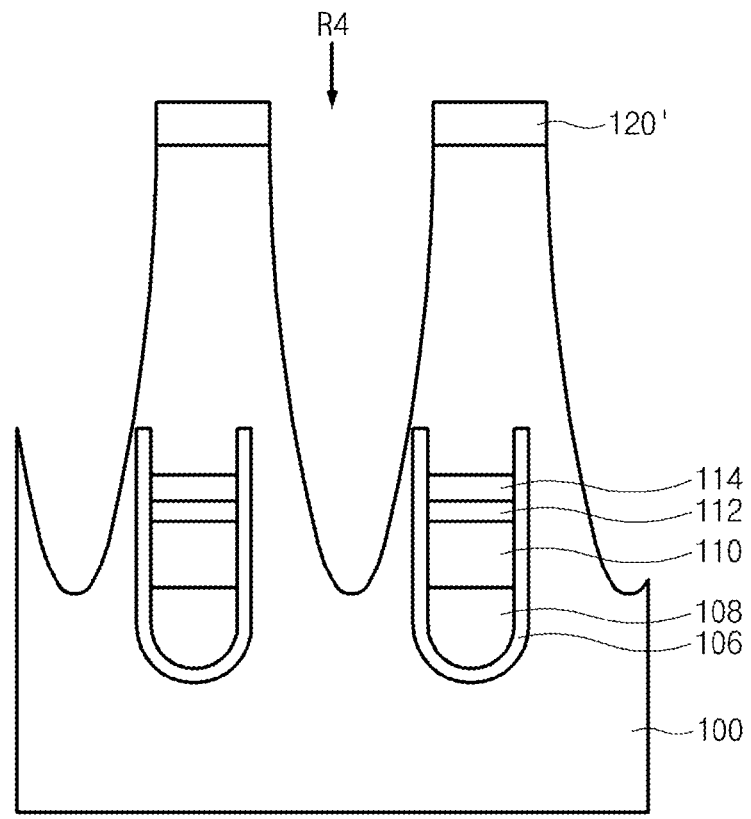
FIGS. 13 and 14 are cross-sectional views showing a method for manufacturing the semiconductor device of FIG. 12.
Figure 14:
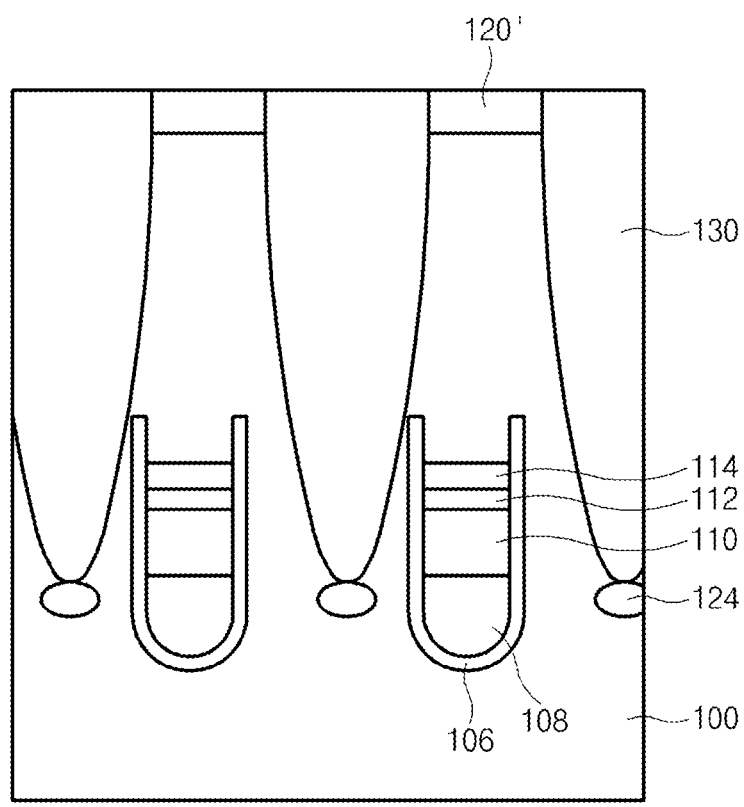

FIG. 12 is a cross-sectional view illustrating a semiconductor device according to another embodiment of the present invention. FIGS. 13 and 14 are cross-sectional views showing a method for manufacturing the semiconductor device of FIG. 12. In FIG. 12, for convenience of description and better understanding of the present invention, the same reference numerals as those of FIG. 1 represent the same elements. In FIGS. 13 and 14, the same reference numerals as those of FIGS. 2 to 11 represent the same elements.

The body connection unit 32 of FIG. 1 is symmetrically formed. That is, the body connection unit 32 shown in FIG. 1 is formed at the first and the second sidewalls of the pillar 12. Compared with the body connection unit 32 of FIG. 1, the body connection unit 36 of FIG. 12 is asymmetrically formed. That is, the body connection unit 36 is formed only at one of the first and the second sidewalls of the pillar 12.

In order to form the asymmetrical body connection unit 36, the silicon layer 118 may be formed using any one of the methods shown in FIGS. 1 to 5. However, as shown in FIG. 12, a hard mask pattern 120' may be biased to one side over the bit line 16 (110 in FIGS. 13 and 14) and formed wider than the hard mask pattern 120 shown in FIG. 6. That is, as illustrated by the intermediate structure shown in FIG. 13, the hard mask pattern 120' is formed to be wider than the hard mask pattern 120 in such a manner that, with respect to the orientation of the figure, the width of mask pattern 120' over the bit line 10 overlaps with the width of the bit line 110 and extends beyond the bit line 16 on one side.

Subsequently, the silicon layer 118 is obliquely etched using the hard mask pattern 120' as an etch mask, so that a recess R4 is formed.

In an embodiment, the recess R4 is etched down to a level lower (or deeper) than a bottom of the bit line 110, so that the air-gap 28 of FIG. 1 need not be additionally formed between the bit lines 16.

Therefore, in forming the semiconductor device of FIG. 12, the spacer 122 formed at any of the first and the second sidewalls of the recess R4 or a bottom surface of the recess R4 may not be necessary. The field stop layer 124 is formed by implanting P-type impurities into a lower part of the recess as shown in FIG. 14. Subsequently, the insulation film 130 is formed to fill the recess R4.

Subsequent processes may be achieved using the same methods shown in FIGS. 10 and 11, and a detailed description thereof will be omitted for convenience of description and better understanding of the present invention.

Even in the case of the embodiment of FIG. 1, when the recess R2 of FIG. 6 extends down to a level lower than the bottom surface of the bit line 110, formation of an air-gap between bit lines may be unnecessary.

Figure 15:
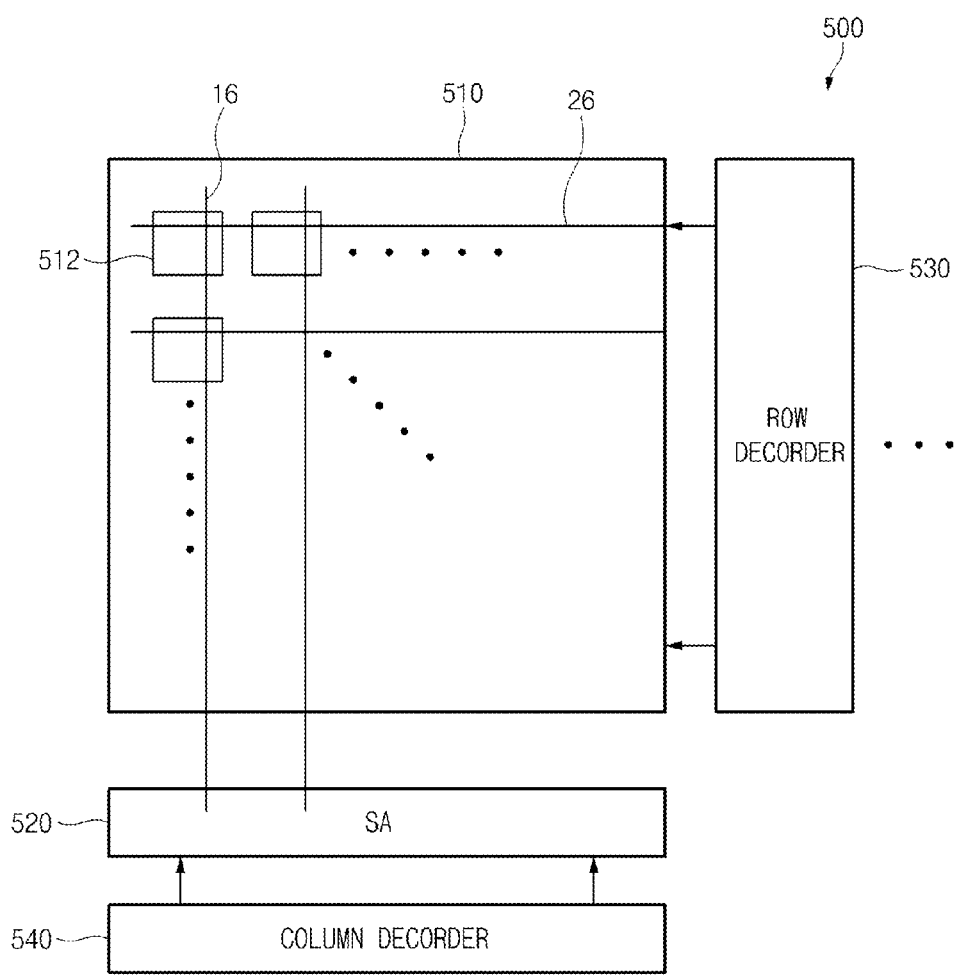
FIG. 15 is a block diagram illustrating a semiconductor device employing a cell structure shown in FIG. 1 or FIG. 12 and a peripheral region of the semiconductor device.

FIG. 15 is a block diagram illustrating a semiconductor device having a cell structure shown in FIG. 1 or FIG. 12 and a peripheral region of the semiconductor device.

Referring to FIG. 15, the semiconductor device 500 may include a memory cell array 510, a sense amplifier (SA) 520, a row decoder 530, and a column decoder 540.

The cell array 510 includes several memory cells 512, that are coupled to a word line (gate) 26 and the bit line 16 and are arranged in the form of a matrix. In an embodiment, a transistor of each memory cell 512 has a vertical channel structure as shown in FIG. 1 or FIG. 12, and includes the body connection unit 32 or 36 formed at least at one sidewall of the pillar 12. The body connection unit 32 or 36 may be formed symmetrically or asymmetrically with respect to the bit line 110.

The sense amplifier 520 is coupled to the bit line 16 so that it can sense and amplify data transferred to/from the memory cell 512 of the cell array 510.

The row decoder 530 generates a word line selection signal for selecting the memory cell 512 in which data is to be read or written, and outputs the word line selection signal to the word line 26.

The column decoder 540 generates a drive signal for operating the sense amplifier 520 coupled to the cell 512 selected by the row decoder 530, and outputs the drive signal to the sense amplifier 520.

The sense amplifier 520 and the decoders 530 and 540 have been designed to be used for general semiconductor devices, and as such a detailed description thereof will herein be omitted for convenience of description and better understanding of the present invention.

The semiconductor device can be applied to computing memories (for example, DRAM, SRAM, DDR3 SDRAM, DDR2 SDRAM, DDR SDRAM, etc.), consumer memories (for example, DDR3 SDRAM, DDR2 SDRAM, DDR SDRAM, SDR SDRAM, etc.), graphics memories (for example, DDR3 SDRAM, GDDR3 SDMRA, GDDR4 SDRAM, GDDR5 SDRAM, etc.), mobile memories (for example, Mobile SDR, Mobile DDR, Mobile DDR2, MCP (Multi Chip Package), PoP (Package on Package), PSRAM, LPDDR), a Synchronous Graphics RAM (SGRAM), and the like.

Figure 16:
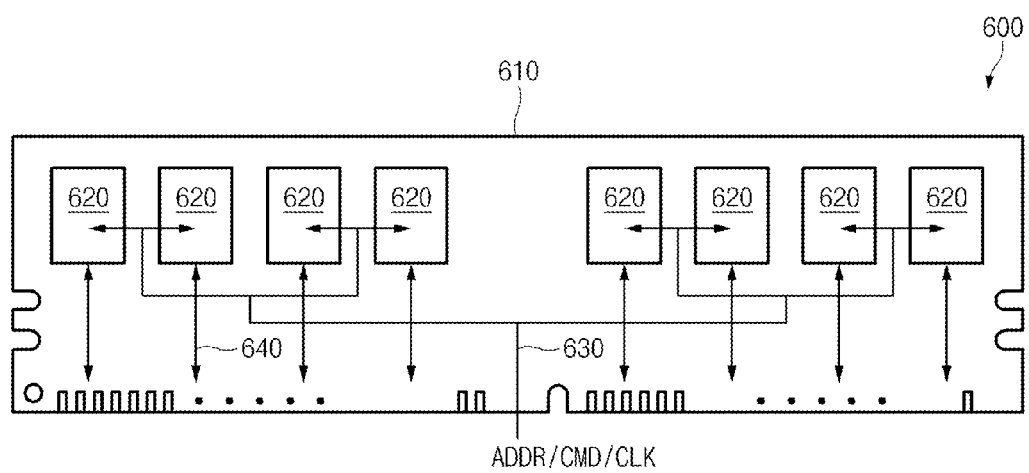
FIG. 16 shows a semiconductor module according to an embodiment of the present invention.

FIG. 16 shows a semiconductor module according to one embodiment of the present invention.

Referring to FIG. 16, the semiconductor module 600 includes a plurality of semiconductor elements 620 mounted to a module substrate 610, a command link 630 for allowing each semiconductor element 620 to receive control signals (for example, an address signal (ADDR), a command signal (CMD), and a clock signal (CLK)) from an external controller (not shown), and a data link 640 coupled to the semiconductor element 620 so as to transmit input/output (I/O) data.

In an embodiment, the semiconductor elements 620 may be exemplarily implemented as the semiconductor devices 500 shown in FIG. 15. Each semiconductor element 620 mounted to the module substrate 610 is formed to have a vertical channel structure as shown in FIG. 1 or FIG. 12, and includes the body connection unit (32 or 36) in which one or both sides of the pillar 12 is coupled to the semiconductor substrate. The command link 630 and the data link 640 may be formed to be identical or similar to those of general semiconductor modules.

Although eight semiconductor elements 620 are mounted to the front surface of the module substrate 610 as shown in FIG. 16, it should be noted that the semiconductor elements 620 can also be mounted to the back surface of the module substrate 610. That is, the semiconductor elements 620 may be mounted to one side or both sides of the module substrate 610, and the number of mounted semiconductor elements 620 is not limited to the example of FIG. 16. In addition, a material and structure of the module substrate 610 are not specially limited.

Figure 17:
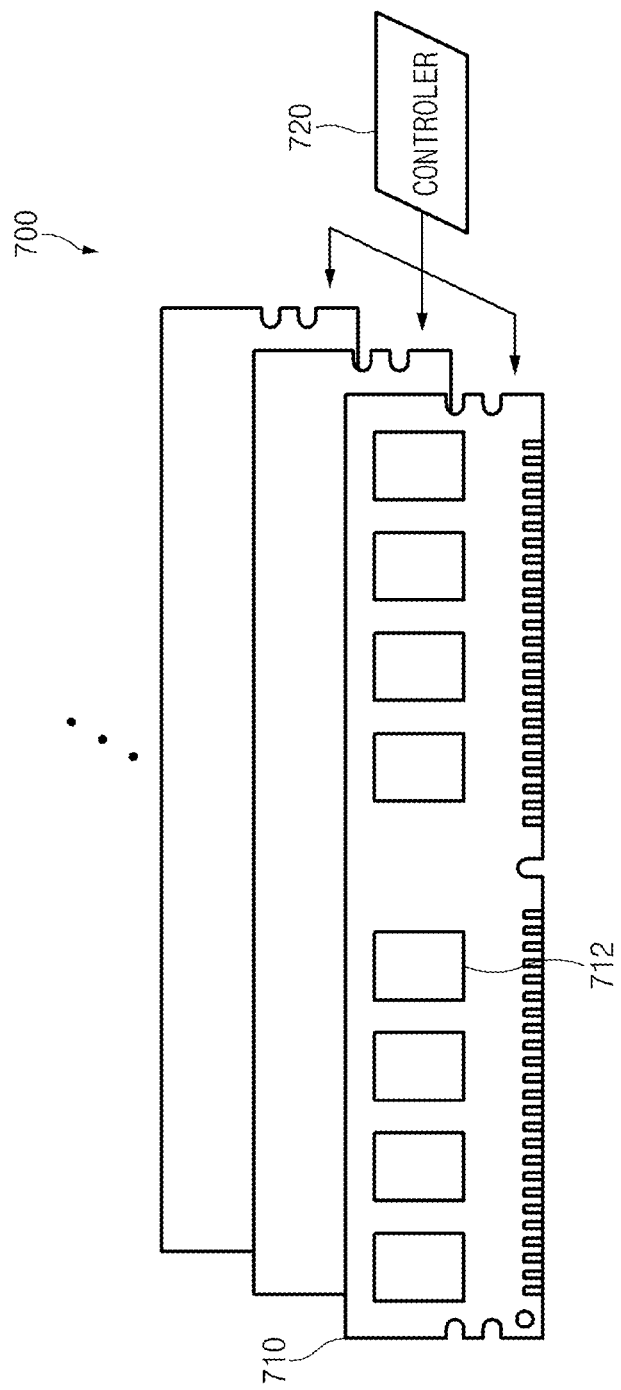
FIG. 17 shows a semiconductor system according to an embodiment of the present invention.

FIG. 17 shows a semiconductor system according to one embodiment of the present invention.

Referring to FIG. 17, a semiconductor system 700 includes at least one semiconductor module 710 including a plurality of semiconductor elements 712, and a controller 720 for providing a bidirectional interface between each semiconductor module 710 and an external system (not shown) so as to control the operations of the semiconductor module 710.

The controller 720 may be identical or similar in function to a controller for controlling a plurality of semiconductor modules for use in a general data processing system, and as such a detailed description thereof will be omitted herein for convenience of description.

In this case, the semiconductor module 710 may be, for example, a semiconductor module 600 shown in FIG. 16.

Figure 18:
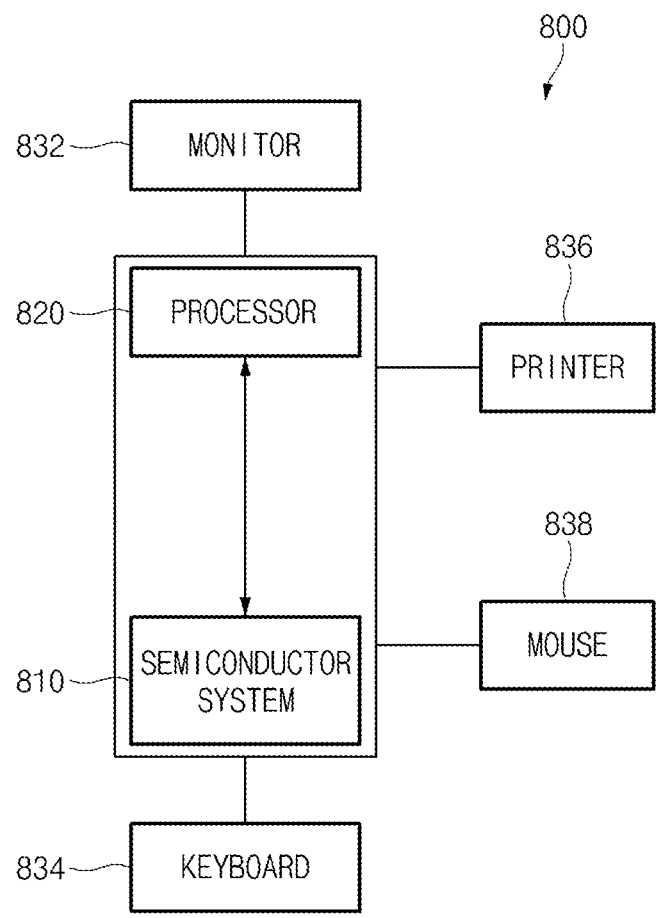
FIG. 18 shows a computer system according to an embodiment of the present invention.

FIG. 18 shows a computer system according to one embodiment of the present invention.

Referring to FIG. 18, the computer system 800 includes a semiconductor system 810 and a processor 820 such as a Central Processing Unit (CPU).

The semiconductor system 810 may store data requisite for controlling the operations of the computer system 800. In this case, the semiconductor system 810 may exemplarily be used as the semiconductor system 700 shown in FIG. 17.

The processor 820 controls the operations of the computer system 800 by processing data stored in the semiconductor system 810. The processor 820 may be identical or similar in function to the CPU used in a general computer system.

The computer system 800 may include a variety of user interface devices, for example, a monitor 832, a keyboard 834, a printer 836, a mouse 838, etc.

Figure 19:
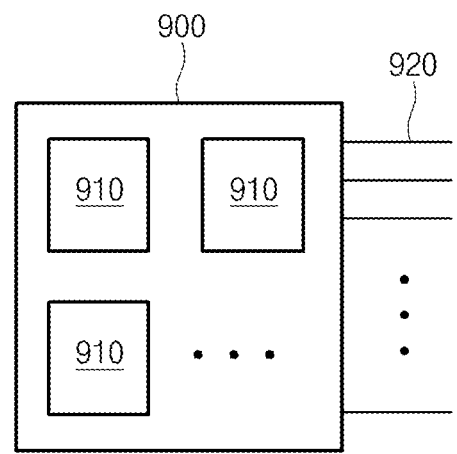
FIG. 19 shows a data processing system according to an embodiment of the present invention.

FIG. 19 shows a data processing system according to one embodiment of the present invention.

Referring to FIG. 19, the data processing system 900 is included in an electronic system (not shown), such that it performs a specific function from among several functions of the electronic system.

The data processing system 900 may include at least one semiconductor device 910 mounted to the substrate.

The semiconductor device 910 includes a cell array (not shown) for storing data needed for performing a specific function of the electronic system, and a processor (not shown) for performing the corresponding function by processing the data stored in the cell array. That is, the semiconductor element device 910 includes a unit for storing data in one unit element (die or chip) and a unit for performing a specific function of the electronic system by processing the stored data.

In this case, the cell array may include the cell array 510 shown in FIG. 15.

The data processing system 900 is coupled to other constituent elements (for example, CPUs) of the electronic system through leads 920, such that it can unidirectionally or bidirectionally transmit and receive data and control signals.

Figure 20:
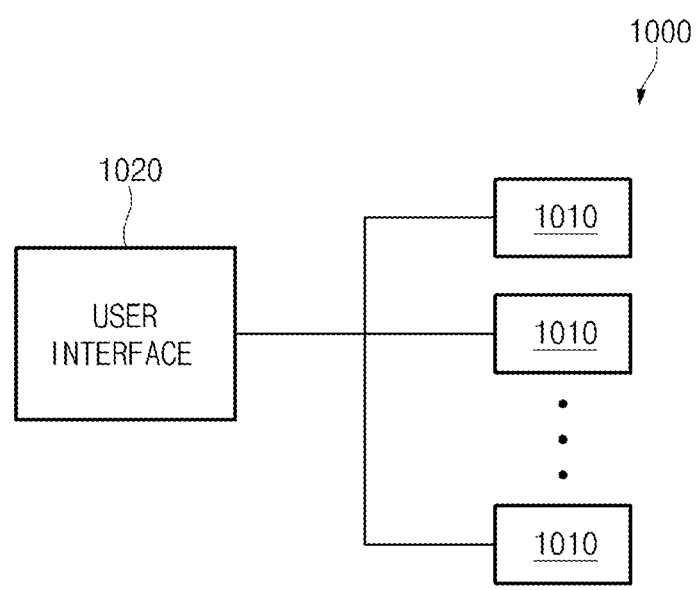
FIG. 20 shows an electronic system according to an embodiment of the present invention.

FIG. 20 shows an electronic system according to one embodiment of the present invention.

Referring to FIG. 20, the electronic system 1000 includes at least one data processing system 1010 and a user interface 1020.

The data processing system 1010 performs a specific function from among several functions of the electronic system 1000, and includes at least one semiconductor device mounted to the substrate. The semiconductor device may include a cell array (not shown) for storing data needed for performing a specific function of the electronic system 1000 and a processor (not shown) for controlling the corresponding function by processing the data stored in the cell array. In this case, the cell array may be the cell array 510 shown in FIG. 15.

The user interface 1020 provides an interface between the user and the circuit module 1010. The user interface 1020 may include a keypad, a touchscreen, a speaker, etc. incorporated into the electronic device.

The electronic system 1000 includes a variety of embedded systems included in various electronic, information, and communication devices, for example, computers, household appliances, factory automation systems, elevators, mobile phones, etc.

As is apparent from the above description, the vertical channel region formed according to an embodiment of the present invention can effectively prevent a pillar body from being floated in a semiconductor device.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A vertical semiconductor device comprising:
   a pillar having a vertical channel region;
   a bit line buried in a semiconductor substrate and located under the pillar; and
   a first body connection unit coupling a first vertical portion of a first sidewall of the pillar to the semiconductor substrate; and
   a second body connection unit coupling a second vertical portion of a second sidewall of the pillar to the semiconductor substrate, the first vertical portion of the pillar being disposed opposite to the second vertical portion of the pillar,
   wherein the first and the second body connection units are integrated with the pillar in a single body.

2. The vertical semiconductor device according to claim 1, further comprising:
   a lower junction region disposed between the pillar and the bit line; and
   an upper junction region disposed over the pillar.

3. The vertical semiconductor device according to claim 2, wherein each of the lower junction region and the upper junction region includes an amorphous silicon layer or polysilicon layer doped with impurities.

4. The vertical semiconductor device according to claim 3, further comprising:
   a barrier metal layer disposed between the lower junction region and the bit line.

5. The vertical semiconductor device according to claim 1, further comprising:
   a gate coupled to a third vertical portion of the pillar.

6. The vertical semiconductor device according to claim 5, wherein the first and second body connection units do not couple the semiconductor substrate to the third vertical portion of the pillar.

7. The vertical semiconductor device according to claim 1, further comprising:

a first insulation film disposed below the bit line; and a second insulation film disposed below the first insulation film and both sidewalls of the bit line.

8. The vertical semiconductor device according to claim 1, wherein the first and the second body connection units are symmetrically arranged with respect to the pillar.

9. The vertical semiconductor device according to claim 1, wherein the first body connection unit and the second body connection unit are asymmetrically arranged with respect to the pillar.

10. The vertical semiconductor device according to claim 1, wherein the pillar and the first and second body connection units are an epitaxial growth layer.

11. The vertical semiconductor device according to claim 1, wherein the first and second body connection units include the same material as the pillar.

12. The vertical semiconductor device according to claim 1, the device further comprising:

an air-gap located between the bit line and an adjacent bit line.

13. The vertical semiconductor device according to claim 12, the device further comprising:

a field stop layer formed by implanting impurities into a lower portion of the air-gap.

14. A semiconductor device including a vertical channel region, the device comprising:

a semiconductor substrate;

a pillar protruding from the substrate, the pillar including a first body connection portion and a second body connection portion; and a bit line disposed in a lower portion of the pillar, wherein the first and second body connection portions are disposed at both sidewalls of the pillar, respectively, and form a continuous body between an upper portion of the pillar and the substrate.

15. The semiconductor device of claim 14, wherein the sidewalls of the pillar are defined by tapered recesses.

16. The semiconductor device of claim 15, wherein tapers of the tapered recesses are oriented such that lower portions of the pillar are wider than upper portions of the pillar.

17. The semiconductor device of claim 15, wherein the tapered recesses are substantially the same.

18. The semiconductor device of claim 15, wherein an upper surface of the bit line is above a lower surface of the recess.

19. The semiconductor device of claim 14, further comprising:

an insulation film disposed around lower and side surfaces of the bit line, the insulation film including end portions, the end portions of the insulation film extending past a lower junction region disposed over the bit line.

* * * * *